United States Patent [19]

Grebe et al.

[11] Patent Number: 5,274,913
[45] Date of Patent: Jan. 4, 1994

[54] METHOD OF FABRICATING A REWORKABLE MODULE

[75] Inventors: Kurt R. Grebe, Beacon, N.Y.; Jack M. McCreary, Fayetteville, GA; Darbha Suryanarayana, Vestal; Ho-Ming Tong, Yorktown Heights, both of N.Y.

[73] Assignee: International Business Machines Corporation, Armonk, N.Y.

[21] Appl. No.: 782,701

[22] Filed: Oct. 25, 1991

[51] Int. Cl.⁵ .............................................. H05K 3/34
[52] U.S. Cl. ........................................ 29/840; 29/841; 437/209
[58] Field of Search ................... 29/843, 841; 437/209; 174/52.2; 257/697

[56] References Cited

U.S. PATENT DOCUMENTS

| 4,143,456 | 3/1979 | Inoue | 174/52.2 X |
| 4,323,914 | 9/1982 | Berndlmaier | 257/697 X |
| 4,942,140 | 7/1990 | Ootsuki et al. | 174/52.2 X |
| 5,120,678 | 6/1992 | Moore et al. | 29/841 X |

FOREIGN PATENT DOCUMENTS

| 348972 | 1/1990 | European Pat. Off. | 437/209 |
| 62-147735 | 7/1987 | Japan | 437/209 |
| 63-65632 | 3/1988 | Japan | 437/209 |
| 1-55832 | 3/1989 | Japan | 437/209 |
| 2-84747 | 3/1990 | Japan | 437/209 |

OTHER PUBLICATIONS

"Xylene Polymers", Encyclopedia of Polymer Science & Technology, vol. 17, Second Edition, pp. 990-1025.

Primary Examiner—Carl J. Arbes
Attorney, Agent, or Firm—Richard M. Goldman

[57] ABSTRACT

Disclosed is a reworkable circuit package formed by controlled collapse chip connection ("C4") bonding of integrated circuit chips to circuit cards and boards, and direct chip attachment ("DCA") where an encapsulant is disposed under the chip. The encapsulant offers protection of the C4 connections and a thermal expansion matched to that of the C4 joints. However, most encapsulants interfere with reworkability. The disclosed circuit package overcomes this problem by the provision of a passivating layer of Parylene is reworkable, dry processable, uniformly depositable by vapor phase deposition, forming thin films on facing surfaces at the 3-5 micron film thickness corresponding to the C4 lift-off distance.

4 Claims, 1 Drawing Sheet

METHOD OF FABRICATING A REWORKABLE MODULE

FIELD OF THE INVENTION

The invention relates to controlled collapse chip connection ("C4") bonding of integrated circuit chips to circuit cards and boards. More particularly the invention relates to direct chip attachment ("DCA") where an encapsulant, e.g., an epoxy encapsulant, is disposed under the chip. The epoxy encapsulant offers such advantages as (i) low temperature encapsulant cure, (ii) easy manufacturability, especially in that the encapsulant is easily dispensable and readily flows underneath the chip between the chip and the card or board, encapsulating the C4 chip connections, (iii) the absence of volatiles, and (iv) thermal expansion matched to that of the C4 joints.

One problem of epoxy encapsulation is that the epoxy is not reworkable, thereby rendering the structure non-reworkable. According to the invention, the problem of non-reworkability is overcome by providing a polymeric passivating layer capable of acting as a release agent between the integrated circuit chip and the card or board.

According to the invention the passivating layer is provided by para-xylylene ("parylene"), an encapsulant having the formula

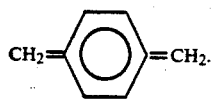

Parylene is particularly desirable because it is reworkable, dry processable, uniformly depositable by vapor phase deposition, and capable of forming a substantial pin hole free, conformal coating on facing surfaces separated by the 3–5 micron film thickness corresponding to the C4 lift-off distance. Moreover, para-xylylene is resistant to solvents, and thus forms a barrier around the C4 connector and protects the from corrosive ions, during especially during fabrication processing.

The microelectronic circuit package of the invention has a circuitized substrate with terminals. An integrated circuit chip is bonded to the circuitized substrate at the terminals by C4 solder bumps. The para-xylylene is present as a film coating the substrate and solder bumps, and a second film encapsulates the circuitized substrate, the solder bumps, and the integrated circuit chip.

The circuit package is prepared by forming discrete solder deposits on either or both of solder wettable terminals on the integrated circuit chip or on the the substrate. The substrate terminals and the chip terminals are aligned, and the solder is reflowed to form the C4 connections. The para-xylylene is then vapor deposited and polymerized on the package, between the substrate and the integrated circuit chip, encapsulating the C4 connections. An epoxy encapsulant is deposited atop the substrate and integrated circuit chip, as well as under the integrated circuit chip, filling the gap between the integrated circuit chip and the substrate.

Since the para-(xylylene) polymer acts as a release layer, the package is reworkable by removing the epoxy with a depotting solution, and removing the chip by pulling. Typical pull strengths are 230 pounds inch$^{-2}$ for compass integrated circuit chips.

BACKGROUND 0 THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements. Fourth, the second level package provides for thermal management, i.e., heat dissipation.

In order for the card to accomplish these functions the I/C chip must be bonded to the card, and connected to the wiring of the card. When the number of I/O's per chip was low, serial wire bonding of the I/O's around the periphery of the chip was a satisfactory interconnection technology. But, as the number of I/O's per chip has increased, tape automated bonding (hereinafter "TAB" bonding) has supplanted serial wire bonding. To handle an even larger number of I/O's per chip various "flip chip" bonding methods were developed. In these so-called "flip chip" bonding methods the face of the IC chip is bonded to the card.

Flip chip bonding is described by Charles G. Woychik and Richard C. Senger, "Joining Materials and Processes in Electronic Packaging," in Donald P. Seraphim, Ronald Lasky, and Che-Yo Li, *Principles of Electronic Packaging*, McGraw-Hill Book Company, New York, N.Y., (1988), at pages 577 to 619, and especially pages 583 to 598, and by Nicholas G. Koopman, Timothy C. Reiley, and Paul A. Totta, "Chip-To-Package Interconnections" in Rao R. Tummala and Eugene Rymaszewski, *Microelectronic Packaging Handbook,* Van Nostrand Reinhold, New York, N.Y. (1988), at pages 361 to 453, and especially pages 361 to 391, both of which are hereby incorporated herein by reference. As described therein, flip-chip bonding allows forming of a pattern of solder bumps on the entire face of the chip. In this way the use of a flip chip package allows full population area arrays of I/O. In the flip chip process solder bumps are deposited on solder wettable terminals on the chip and a matching footprint of solder wettable terminals are provided on the card. The chip is then turned upside down, hence the name "flip chip," the solder bumps on the chip are aligned with the footprints on the substrate, and the chip to card joints are all made simultaneously by the reflow of the solder bumps.

In the C4 process, as distinguished from the earlier flip chip process, the solder wettable terminals on the chip are surrounded by ball limiting metallurgy ("BLM"), and the matching footprint of solder wettable terminals on the card are surrounded by glass dams or stop-offs, which are referred to as top surface metallurgy ("TSM"). These structures act to limit the flow of molten solder during reflow.

The ball limiting metallurgy ("BLM") on the chip is typically a circular pad of evaporated, thin films of Cr, Cu, and/or Au, as described, for example by P. A. Torta and R. P. Sopher, "STL Device Metallurgy and Its Monolithic Extension," *IBM Journal of Res. and Dev.,* 13 (3), p. 226 (1969), incorporated herein by reference. The Cr dam formed by this conductive thin film well restrains the flow of the solder along the chip, seals the chip module, and acts as a conductive contact for the solder. In prior art processes the BLM and solder are deposited by evaporation through a mask, forming an array of I/0 pads on the wafer surface. The term "mask" is used generically. The mask can be a metal mask. Alternatively, as used herein, the "mask" can refer to a sequence of BLM deposition, photoresist application, development of the photoresist, and deposition, as described below, of solder, followed by simultaneous removal of the photoresist and subetching of the BLM, with the solder column acting as a mask.

In C4 processes the Pb/Sn is typically deposited from a molten alloy of Pb and Sn. The Pb has a higher vapor pressure then Sn, and deposits first, followed by a cap of Sn. The solder is deposited on the chip by evaporation, vacuum deposition, vapor deposition, or electrodeposition into the above described BLM wells, thereby forming solder columns therein. The resulting solder deposit, referred to herein as a column or a ball, is a conefrustrum body of Pb surrounded by an Sn cap. This column or ball may be reflowed, for example by heating in an $H_2$ atmosphere, to homogenize the solder and form solder bumps for subsequent bonding.

The solder is typically a high lead solder, such as 95 Pb/5 Sn. In conventional C4 processes, 95/5 solders are preferred because the high lead solders of this stoichiometry have a high melting point, e.g., above about 315 degrees Centigrade. Their high melting temperature allows lower melting point solders to be used for subsequent connections in the microelectronic package.

The wettable surface contacts on the card are the "footprint" mirror images of the solder balls on the chip I/O's. The footprints are both electrically conductive and solder wettable. The solder wettable surface contacts forming the footprints are formed by either thick film or thin film technology. Solder flow is restricted by the formation of dams around the contacts.

The chip is aligned, for example self-aligned, with the card, and then joined to the card by thermal reflow. Typically, a flux is used in prior art C4 processes. The flux is placed on the substrate, or chip, or both, to hold the chip in place. The assembly of chip and card is then subject to thermal reflow in order to join the chip to the card. After joining the chip and card it is necessary to remove the flux residues. This requires the use of organic solvents, such as aromatic solvents and halogenated hydrocarbon solvents, with their concomitant environmental concerns.

To be noted is that the C4 process is a substantially self-aligning assembly process. This is because of the interaction of the geometry of the solder columns or balls prior to reflow with the surface tension of the molten solder during reflow and geometry of the solder columns. When mating surfaces of solder column on the chip and the conductive footprint contact on the card touch, the surface tension of the molten solder will result in self alignment.

C4 bonding can also be used in Direct Chip Attach ("DCA"). Direct Chip Attach is the general name applied to a chip-substrate connection used to eliminate the first level of packaging (as SMT or TAB). Direct Chip Attach is a low cost, high throughput process, in which the chip is bonded, for example, C4 bonded, directly to the card or board.

For Direct Chip Attach, the individual IC chips are (C4) mounted on the cards or boards, and the mounted chip and the card or board are then encapsulated with a low coefficient of thermal expansion encapsulant, as epoxy resin. By this expedient, the "standoff" between the IC chip and the card or board is encapsulated with epoxy.

Because of the use of a polymeric dielectric card or board, the Direct Chip Attach process requires low temperature solder metallurgy that also allows "standoff." Moreover, Direct Chip Attach encapsulation increases the resistance of the C4 solder interconnections to thermal cycling, acts as an alpha emission barrier to MOSFET memory chips, is a parallel thermal path for heat dissipation, and provides physical protection to the chips and C4 solder interconnections.

One problem encountered with the combination of Direct Chip Attach and and C4 bonding is the difficult of reworking the encapsulated package. This is because, notwithstanding the advantages of the epoxy encapsulant, for example: (i) low temperature encapsulant cure, (ii) easy manufacturability, (iii) the absence of volatiles, and (iv) thermal expansion matched to that of the C4 joints, epoxy is a difficult material to remove for rework.

This rework difficulty renders the structures effectively non-reworkable. This reduces yield and thereby increases costs.

OBJECTS OF THE INVENTION

It is one object of the invention to provide for reworkability of C4 bonded, DCA encapsulated electronic packages.

It is a further object of the invention to increase the effective yield, i.e., the reworked yield, of C4 bonded, DCA encapsulated packages.

SUMMARY OF THE INVENTION

The shortcoming of the prior art are obviated and the objects of the of the invention are attained by the method and apparatus of the invention.

The invention provides a reworkable solder bonded, encapsulated microelectronic circuit package. The circuit package has a circuitized substrate, with electrical interconnect terminals and an integrated circuit chip with complimentary, facing terminals. The terminals are metallurgically and electrically connected at solder bumps. The bumps bond the integrated circuit chip to said circuitized substrate at the respective terminals on the substrate and chip. Reworkability is provided by the multilayer, polymeric encapsulant. The encapsulant has a removable first polymeric film directly on the substrate, surrounding the solder bumps, and a second polymeric film. The second polymeric film overlays the first film and encapsulates the integrated circuit chip, the solder bumps, and the substrate.

According to the invention the removable first polymeric film on the substrate, that is, the layer directly in contact with the solder bumps and the substrate is poly (para-xylylene). The poly (para-xylylene) first polymeric film is from about 3 to 5 microns thick. The poly (para-xylylene) is removable from the integrated circuit chip, solder bumps, and substrate, so that the outer polymeric film encapsulating the integrated circuit chip, solder bumps, and substrate may be epoxy.

According to a further embodiment of the invention, the circuit package is prepared by first forming or providing discrete solder deposits on wettable metal terminals on the chip and/or on the substrate, and aligning the chip terminals and the substrate terminals. The solder is then reflowed to form solder connections. A poly (para-xylylene) precursor is then polymerized to form a thin layer of removable poly (para-xylylene) on the substrate between the substrate and chip. This encapsulates the solder connections. The package and the chip are then encapsulated with a second polymer, for example, an epoxide.

This construction and fabrication method provides reworkability to the microelectronic circuit package, such that the integrated circuit chip can be removed from the package substrate. Thus, according to the method of the invention the second, encapsulating film, that is, the epoxide, is removed from the package. Once this is removed, as by the use of a depotting solution, the solder can be melted, and the integrated circuit chip removed. The poly (para-xylylene) film is removed. This allows the solder to be cleaned, and new discrete solder deposits to be formed on the wettable metal terminals on the chip and/or the substrate. The chip terminals and the substrate terminals are then realigned and the solder reflowed to form new solder connections. A new thin layer of the removable poly (para-xylylene) is then formed on the substrate between the substrate and chip to encapsulate the solder connections. The package is then encapsulated with the second polymer, for example, epoxide.

According to the invention increased reworkability is provided for C4 bonded, DCA encapsulated electronic packages. This increased reworkability increases the effective yield, i.e., the reworked yield, of C4 bonded, DCA encapsulated packages.

THE FIGURES

The invention may be understood by reference to the FIGURES appended hereto.

DETAILED DESCRIPTION OF THE INVENTION

Figure 1:
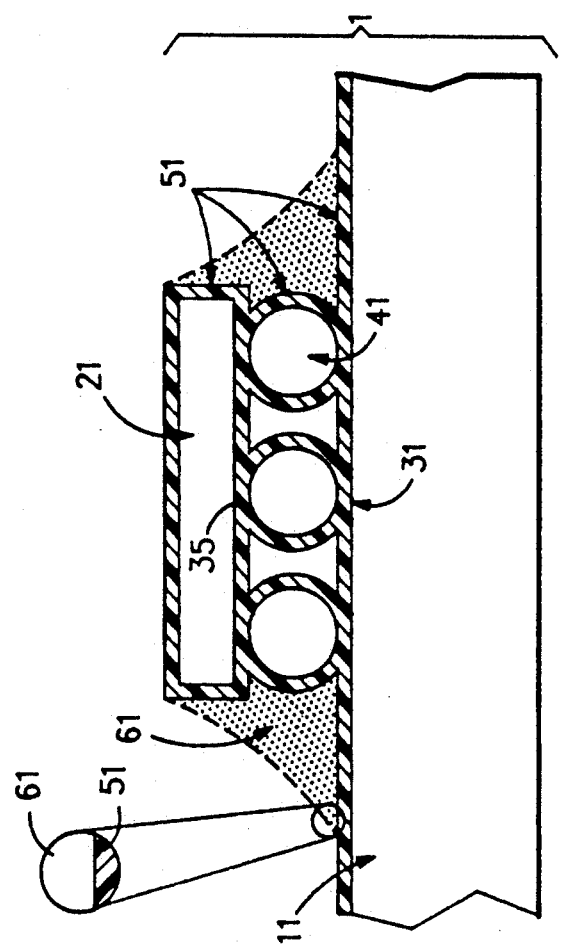
FIG. 1 is a cutaway view of an encapsulated chip, solder bond array, and substrate of the invention.

The invention provides a reworkable, solder bonded, encapsulated microelectronic circuit package, 1 of FIG. 1. The circuit package 1 has a circuitized substrate 11, with electrical interconnect terminals 31 and an integrated circuit chip 21 with complimentary, facing terminals 35. The terminals 31, 35 are metallurgically and electrically connected at solder bumps 41. The solder bumps 41 bond the integrated circuit chip 21 to the circuitized substrate 11 at the respective terminals 31, 35 on the substrate 11 and chip 21.

Reworkability is provided by the multilayer, polymeric encapsulant. The encapsulant has a removable first polymeric film 51 directly on the substrate 11, surrounding the solder bumps 41, and a second polymeric film 61. The second polymeric film 61 overlays the first film 51 and further encapsulates the integrated circuit chip 21, the solder bumps 41, and the substrate 11.

According to the invention the removable first polymeric film 51 on the substrate 11, that is, the layer directly in contact with the solder bumps 41 and the substrate 11, is poly (para-xylylene). The poly (para-xylylene) first polymeric film 51 is from about 3 to 5 microns thick. The poly (para-xylylene) is removable from the integrated circuit chip 21, solder bumps 41, and substrate 11, so that the outer polymeric film 61 encapsulating the integrated circuit chip 21, solder bumps 41, and substrate 11 may be epoxy, for example a filled epoxy. Filled epoxies used for encapsulation contain about 60 to 70 weight percent fillers, for example, glass fillers. The loading of glass filler is high enough to reduce the coefficient of thermal expansion (CTE) of the encapsulant, so that the encapsulant CTE matches the CTE of the C4 solder joint. The filled encapsulant also increases the life of the C4 solder joint by about one order of magnitude.

Poly (para-xylylenes) are polymers of para-xylylene. Para xylylene has the structure

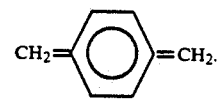

Para-xylylene is prepared by heating para-xylene,

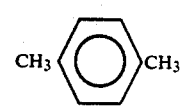

to an elevated temperature, in the presence of steam. This causes the para-xylene to decompose and produce the dimer di-(para-xylylene):

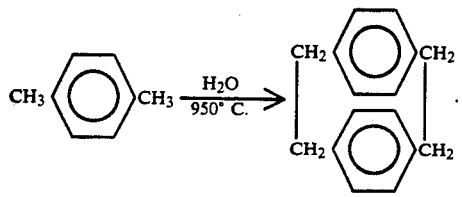

The dimer, di-(para-xylylene) is then pyrolyzed at 550° Centigrade to produce a gas phase para-xylylene monomer:

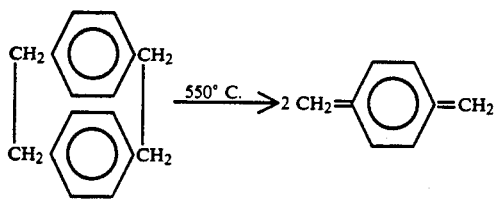

Para-xylylene polymerizes on cooling, for example to temperatures of 50° C. or lower to produce a polymer

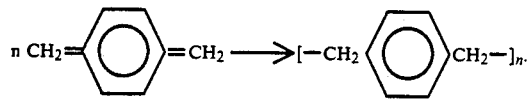

n is on the order of at least about 1000, and generally from about 1000 to about 5000.

Para-xylylene polymers may be substituted, for example on the aromatic ring. Homopolymers include:

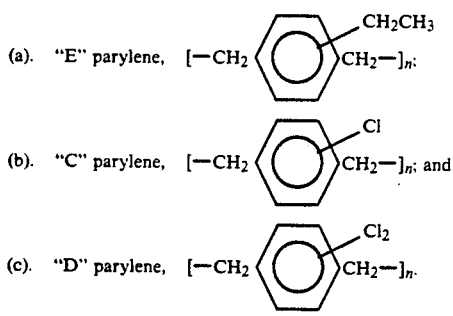

Each of the parylenes has unique properties. For example, parylene C and parylene E are flexible, while parylene D is rigid.

The above illustrated polymerization of p-xylylene when condensed on a cool surface is extremely rapid and is reported to proceed from gaseous para-xylylene monomer to the solid poly (para-xylylene) polymer without first passing through any liquid stage.

The pyrolyzed para-xylylene monomer behaves as a reactive medium, surrounding solid objects placed in the deposition chamber. It is possible to deposit films of uniform thickness on surfaces, such as sharp edges and the "stand-off" between the integrated circuit chip 21 and the substrate 11.

Figure 2:
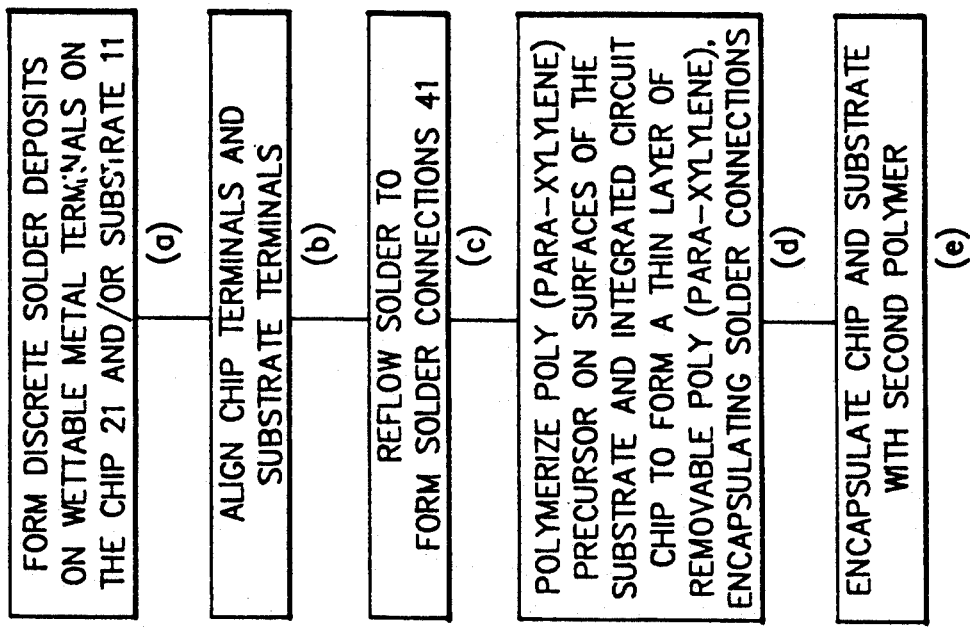
FIG. 2 is a flow chart of the method of the invention.

According to a further embodiment of the invention, illustrated in the flow chart of FIG. 2, the circuit package 1 is prepared by first forming or providing discrete solder deposits on wettable metal terminals 31, 35 on the chip 21 and/or on the substrate 11, as shown in block a. The the chip terminals 35 and the substrate terminals 31 are aligned, as illustrated in block b. The solder is then reflowed to form solder connections 41 as shown in block c. A poly (para-xylylene) precursor is then polymerized on surfaces of the substrate 11 and integrated circuit chip 21 to form a thin layer of removable poly (para-xylylene) 51 on the substrate 11 and chip 21, especially between the substrate 11 and chip 21. The poly (para-xylylene) layer is generally from about 3 microns to about 5 microns thick. It is pin-hole free, substantially crack free, and conformal. This encapsulates the solder connections 41 as shown in block d. The substrate 11 and the chip 21 are then encapsulated with a second polymer, for example, an epoxy, as shown in block e. Typical epoxides include HYSOL ™ FP 4510, which is curable at about 130 degrees Centigrade for about 6 hours.

In the application of para-xylylene to multi-chip (MC) modules, pins may need to be protected during vapor deposition and polymerization of the para-xylylene. This is because poly para(xylylene) is a dielectric. Thus it is necessary to protect pins and pads from inadvertent coating by the poly para(xylylene).

One advantage of the para-xylylene coating is that it results in a conformal coating. This allows vapor deposition on solder bonds 41 underneath the integrated circuit chips 21, as well as on the shadow area of the substrate 11, underneath the integrated circuit chip 21, and on the under side of the chip 21. The poly(p-xylylene) film 51 grows upward and outward from the substrate surface 11 and the integrated circuit surface 21 covering the surfaces and the solder connects 41 with a uniform thick coating 51. This is accomplished without bridging.

A further advantage of the thin film 51 of poly (para-xylylene) is that it is substantially free of cracks and fractures and appears to synergistically interact with the filled epoxy encapsulant. This interaction appears to increase the cycle life and the resistance of the C4 to failure.

A still further advantage of the method of the invention is that, the package 1 remains at or near room temperature through out the para-xylylene deposition process. This eliminates the risk of thermal damage to the dielectric or solder. Coating thickness is controlled easily and very accurately simply by regulating the amount of di-(para-xylylene) vaporized.

This structure and fabrication method of the invention provides reworkability to the microelectronic circuit package 1, such that the integrated circuit chip 21 can be removed from the package substrate 11. Thus, according to the method of the invention the second, encapsulating film 61, that is, the epoxide, is removed from the package. The epoxide layer 61 may be removed by such depotting compositions as DYNA-SOLVE 185 or URESOLVE PLUS SG without effecting the package materials (e.g., polymeric organic substrate materials and Cu) since they are protected by the poly para(xylylene) coating.

Once the epoxide layer 61 is removed, as by the use of a depotting solution, the solder 41 can be melted, and the integrated circuit chip 21 removed. For example, the solder joints 41 on a ceramic module can be broken by heating the package on a 320 degree Centigrade to 370 degree hot plate for about one to 3 and one-half minutes, while the solder joints 41 on an organic polymeric module can be broken by heating the package to 180 degrees Centigrade to 200 degrees Centigrade. The poly (para-xylylene) film 51 is removed, for example by reactive ion etching or laser ablation. This allows the solder to be cleaned, and new discrete solder deposits to be formed on the wettable metal terminals 31, 35 on the chip and/or the substrate. The chip terminals and the substrate terminals are then realigned and the solder reflowed to form new solder connections 41. A new thin layer of the removable poly (para-xylylene) 51 is then formed on the substrate 11 between the substrate 11 and chip 21 to encapsulate the solder connections 41. The package 1 is then encapsulated with the second polymer layer 61, for example, an epoxide layer 61.

While the invention is described with respect to poly(p-xylylene), it is, of course, to be understood that derivatives thereof, such as poly(chloro-p-xylylene), and poly(dichloro-p-xylylene), may also be used.

According to the invention increased reworkability is provided for C4 bonded, DCA encapsulated electronic packages. This increased reworkability increases the effective yield, i.e., the reworked yield, of C4 bonded, DCA encapsulated packages.

While the method and structure of the invention have been described with respect to poly para(xylylene), it is, of course, to be understood that the method of the invention may be utilized with other vapor deposited polymers that act as release agents, such as, for example, fluorocarbons and silanes.

The use of vapor deposited polymers can be used to provide reworkability of solder ball connector (SBC) modules, wire bonded chips, and surface mounted chips.

While the invention has been described with respect to certain preferred exemplifications and embodiments, it is not intended to limit the scope of the claims thereby, but solely by the claims appended hereto.

We claim:

1. A method of reworking a microelectronic circuit package, including removing an integrated circuit chip from the package substrate, said package comprising:
   a. a circuitized substrate having terminals thereon;
   b. an integrated circuit chip having terminals thereon;
   c. solder bumps bonding said integrated circuit chip to said circuitized substrate at said respective terminals;
   d. a removable first polymeric film on said substrate, surrounding the solder bumps; and
   e. a second polymeric film, encapsulating the integrated circuit chip, solder bumps, and substrate;
which method comprises the steps of:
   a. removing the second, encapsulating film;
   b. melting the solder and removing the integrated circuit chip;
   c. removing the removable polymeric film;
   d. forming discrete solder deposits on wettable metal terminals on the chip or the substrate;
   e. aligning the chip terminals and the substrate terminals;
   f. reflowing the solder to form solder connections;
   g. forming a thin layer of the removable polymer on the substrate between the substrate and chip to encapsulate the solder connections; and
   h. thereafter encapsulating the package and the chip with the second polymer.

2. The method of claim 1 wherein the removable first polymeric film on the substrate, surrounding the solder bumps comprises poly (para-xylylene).

3. The method of claim 2 wherein the poly (para-xylylene) first polymeric film is from about 3 to 5 microns thick.

4. The method of claim 1 wherein the second polymeric film encapsulating the integrated circuit chip, solder bumps, and substrate comprises epoxy.

* * * * *